(12) United States Patent
Shindo et al.

(10) Patent No.: US 12,316,074 B2
(45) Date of Patent: May 27, 2025

(54) OPTICAL TRANSMITTER

(71) Applicant: Nippon Telegraph and Telephone Corporation, Tokyo (JP)

(72) Inventors: Takahiko Shindo, Musashino (JP); Meishin Chin, Musashino (JP); Shigeru Kanazawa, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 571 days.

(21) Appl. No.: 17/760,844

(22) PCT Filed: Sep. 26, 2019

(86) PCT No.: PCT/JP2019/037958
§ 371 (c)(1),
(2) Date: Mar. 16, 2022

(87) PCT Pub. No.: WO2021/059449
PCT Pub. Date: Apr. 1, 2021

(65) Prior Publication Data
US 2022/0352692 A1 Nov. 3, 2022

(51) Int. Cl.
*H01S 5/12* (2021.01)
*H01S 5/026* (2006.01)
(Continued)

(52) U.S. Cl.
CPC ............... *H01S 5/12* (2013.01); *H01S 5/026* (2013.01); *H01S 5/0265* (2013.01);
(Continued)

(58) Field of Classification Search
CPC .......... H01S 5/12; H01S 5/026; H01S 5/0265; H01S 5/0601; H01S 5/10; H01S 5/1014; H01S 5/34
See application file for complete search history.

(56) References Cited

U.S. PATENT DOCUMENTS

| | | | | |
|---|---|---|---|---|
| 6,026,106 A | * | 2/2000 | Suzuki | G02B 6/12004 372/50.1 |
| 2005/0006654 A1 | * | 1/2005 | Kang | H01S 5/026 372/50.1 |

(Continued)

FOREIGN PATENT DOCUMENTS

| | | |
|---|---|---|
| JP | 2018-074098 A | 5/2018 |
| WO | 2016/063605 A1 | 4/2016 |

OTHER PUBLICATIONS

W. Kobayashi, et al., *Novel Approach for Chirp and Output Power Compensation Applied to a 40-Gbit/s EADFB Laser Integrated with a Short SOA*, Apr. 2015, Opt. Express, vol. 23, No. 7, pp. 9533-9542.

(Continued)

*Primary Examiner* — Yuanda Zhang
(74) *Attorney, Agent, or Firm* — Workman Nydegger

(57) ABSTRACT

In the present disclosure, in an EADFB laser in which an SOA has been integrated, a new configuration in which a problem of deterioration of optical waveform quality and insufficient optical output is solved or mitigated while taking advantage of characteristics that the same layer structure can be used and a manufacturing process can be simplified is shown. In an optical transmitter of the present disclosure, a waveguide structure having different core widths (waveguide widths) is adopted while using the same layer structure for a DFB laser and the SOA. Waveguides with different core widths are adopted so that a problem of insufficient saturated optical output or waveform deterioration due to a pattern effect is solved and mitigated. A passive waveguide region having a tapered shape is introduced in a part between an EA modulator and the SOA so that a waveguide width is continuously changed.

4 Claims, 12 Drawing Sheets

(51) Int. Cl.
*H01S 5/06* (2006.01)
*H01S 5/10* (2021.01)
*H01S 5/34* (2006.01)

(52) U.S. Cl.
CPC ............ *H01S 5/0601* (2013.01); *H01S 5/10* (2013.01); *H01S 5/1014* (2013.01); *H01S 5/34* (2013.01)

(56) References Cited

U.S. PATENT DOCUMENTS

| | | | |
|---|---|---|---|
| 2015/0092800 A1* | 4/2015 | Zucker | H01S 5/02453 372/29.015 |
| 2017/0250522 A1 | 8/2017 | Koda et al. | |
| 2018/0026424 A1* | 1/2018 | Kobayashi | H01S 5/50 359/245 |

OTHER PUBLICATIONS

K. Morito, et al., *High Power Semiconductor Optical Amplifier*, Mar. 2009, OFC/NFOECC2009, Tutorial, OWQ4.

\* cited by examiner

SOA WIDTH 1.5 μm (b)

SOA WIDTH 1.0 μm (a)

OPTICAL TRANSMITTER

TECHNICAL FIELD

The present invention relates to a semiconductor laser element. Examples of the semiconductor laser element include an optical transmitter including a modulator, a semiconductor optical amplifier, and a laser.

BACKGROUND ART

Hereinafter, a semiconductor laser element in which an electro-absorption (EA) optical modulator is integrated on a substrate is disclosed. Further, an optical transmitter including a distributed feedback (DFB) laser, an EA modulator, and a semiconductor optical amplifier (SOA) is also disclosed.

With the spread of video distribution services and the increase in mobile traffic demand in recent years, network traffic has increased explosively. In optical transmission lines responsible for networks, trends are to increase a transmission rate, reduce power consumption of optical transmission devices, and reduce a cost of the networks through extension of a transmission distance. Semiconductor modulation light sources used in optical transmission devices are also required to have high speed and high output while suppressing an increase in power consumption.

FIG. 1 is a diagram illustrating a schematic configuration of an EA modulator integrated DFB (EADFB) laser. The EADFB laser has a higher extinction property and a better chirp property than a directly modulated laser and has been used in a wide range of applications. As illustrated in FIG. 1 illustrating a cross section (Y-Z plane) of a substrate passing through an optical waveguide, the EADFB laser 10 has a structure in which a DFB laser 1 and an EA modulator 2 have been integrated on the same substrate. The DFB laser 1 includes an active layer 4 composed of a multi quantum well (MQW) and oscillates at a single wavelength determined by a driving current source 8 and a diffraction grating 5 formed in a cavity. Further, the EA modulator 2 includes a light absorption layer 6 including an MQW having a composition different from that of the DFB laser 1 and changes an amount of light absorption through control of an electrical signal source 9. Through driving under a condition that output light from the DFB laser 1 is transmitted or absorbed, the light is blinked and an electrical signal is converted into an optical signal.

Because the EADFB laser is accompanied by a large optical loss in the EA modulator 6, it is difficult to achieve a high output. As a solution to this, an EADFB laser in which a semiconductor optical amplifier (SOA) has been further integrated with a light emission end of the EADFB laser (SOA assisted extended reach EADFB laser: AXEL) has been proposed (NPL 1). Hereinafter, for the sake of simplicity, a laser in which the SOA is further integrated with the EADFB laser is referred to as an AXEL.

FIG. 2 is a diagram illustrating a schematic configuration of an AXEL in which an SOA is integrated. In the AXEL 20 of FIG. 2, which illustrates a cross section (a Y-Z plane) of a substrate passing through an optical waveguide, as in FIG. 1, signal light modulated by an EA modulator 2 is amplified by an integrated SOA region 3, thereby improving optical output. In the configuration of the AXEL 20, a high output of about twice that of a general EADFB laser can be obtained. Further, when the AXEL 20 is driven under an operating condition in which the same optical output as that of the general EADFB laser can be obtained, power consumption can be reduced by about 40% because of a high efficiency operation due to an SOA integration effect. Further, in the AXEL 20, the same MQW structure as the active layer 4 of the DFB laser 1 is used as an active layer 7 of the SOA 3. In the AXEL 20, a device can be made through the same process as in an EADFB laser of the related art without a need to add a regrowth process for integration of the SOA region.

CITATION LIST

Non Patent Literature

NPL 1: W. Kobayashi, et al., "Novel approach for chirp and output power compensation applied to a 40-Gbit/s EADFB laser integrated with a short SOA", April 2015, Opt. Express, Vol. 23, No. 7, pp. 9533-9542

NPL 2: K. Morito, et al., "High power semiconductor optical amplifier", March 2009, OFC/NFOECC2009, Tutorial, OWQ4

SUMMARY OF THE INVENTION

Technical Problem

However, in an AXEL in which an SOA is monolithically integrated, although the same manufacturing process as for the EADFB laser can be used, due to limited degree of freedom in designing a structure of the SOA, there are problems of deterioration of optical waveform quality or an insufficient optical output, as will be described below.

Means for Solving the Problem

One aspect of the present disclosure is an optical transmitter including, on a substrate, a distributed feedback (DFB) laser including an active region with a multi quantum well, an electro-absorption (EA) modulator including an absorption region with a multi quantum well having a composition different from the multi quantum well of the DFB laser, and configured to modulate light emitted from the DFB laser, and a semiconductor optical amplifier (SOA) having an active region with an identical composition as the active region of the DFB laser and configured to amplify signal light from the EA modulator, in which a width of a core layer in a cross section perpendicular to an optical waveguide direction of the SOA differs from a width of a core layer in the cross section perpendicular to the optical waveguide direction of the DFB laser.

Effects of the Invention

With the optical transmitter of the present disclosure, problems of deterioration of optical waveform quality or insufficient optical output are solved and mitigated.

DESCRIPTION OF EMBODIMENTS

Figure 1:
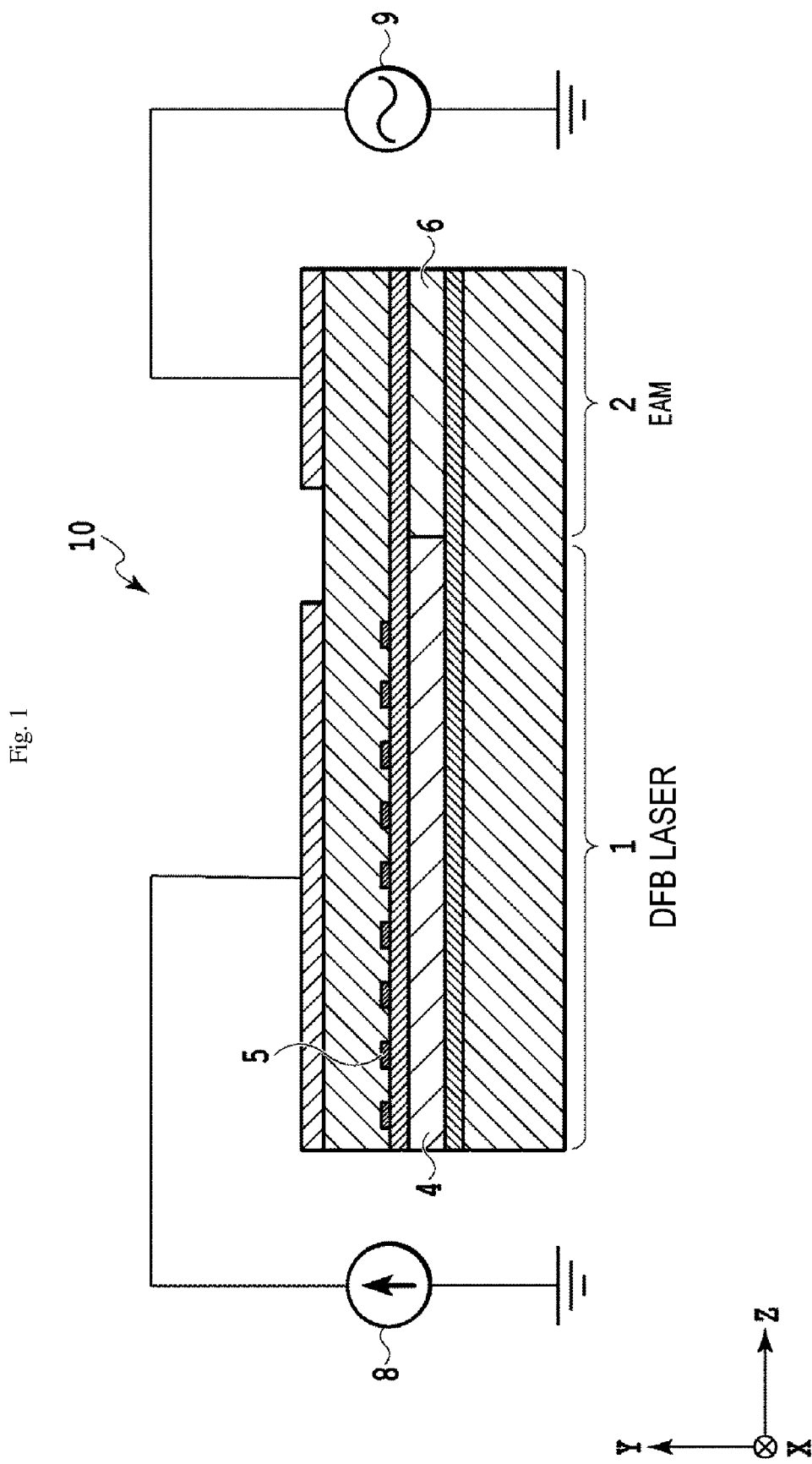
FIG. 1 is a diagram illustrating a schematic configuration of an EA modulator integrated DFB laser.

In the present disclosure, in an EADFB laser in which an SOA has been integrated (hereinafter also referred to as AXEL), a new configuration in which a problem of deterioration of optical waveform quality or insufficient optical output is solved or mitigated while taking advantage of characteristics that the same layer structure can be used and a manufacturing process can be simplified is shown. The EADFB laser in which an SOA has been integrated can operate as an optical transmitter. The EADFB laser also has an aspect as an optical transmission device including the optical transmitter. A configuration and operation of the present disclosure will be described hereinafter as an optical transmitter, but the present disclosure can also be used in various types of devices that provide signal light for carrying information. Further, hereinafter, "AXEL" and "optical transmitter" have substantially the same meaning and are used interchangeably.

First, a structural restriction of the SOA in achieving a high output of the AXEL will be described. As described above, in an AXEL in which an SOA has been integrated, it is possible to achieve an optical output that greatly exceeds that of a typical EADFB laser because of an optical amplification effect of the SOA, but the optical amplification effect is also limited. A typical SOA has a saturated optical output $P_{sat}$ represented by the following equation (NPL 2).

$$P_{sat} = \left(\frac{dw}{\Gamma}\right)\left(hv\frac{1}{a\tau_s}\right) \quad \text{Equation (1)}$$

In Equation (1), $\Gamma$ denotes an optical confinement factor of the active layer (MQW) having an optical gain, d and w denote a thickness and a width of the active layer, respectively, a denotes a differential gain, and $\tau_s$ denotes a carrier lifetime. In the typical SOA, in order to obtain high output characteristics, a layer structure inside the SOA is adjusted in consideration of Equation (1) for an increase in the left term (dw/$\Gamma$) on the right side, so that the saturated optical output $P_{sat}$ can be expanded for a high output of the AXEL. That is, in order to increase the saturated optical output $P_{sat}$ in the SOA, it is preferable to have a waveguide structure in which the optical confinement factor $\Gamma$ is suppressed (dw/$\Gamma$ is increased), an optical gain per unit length is small, and an active layer volume (corresponding to dw) is large.

In the optical waveguide, as a layer structure in which the optical confinement factor of the active layer is maximized, a structure in which upper and lower optical confinement (SCH: Separate Confinement Hetero structure) layers and cladding layers are designed with a symmetrical thickness around the active layer with a high refractive index is known. On the other hand, in order to suppress the optical confinement factor of the active layer small, an asymmetrical layer structure is adopted. Specifically, a thickness of one of two SCH layers above and below the active layer is designed to be thicker than the other without changing a volume of the active layer, or a second SCH layer made of a material having a high refractive index is introduced above or below the active layer. Adoption of such an asymmetrical layer structure makes it possible to adjust an optical field distribution in a vertical direction of a substrate to be displaced from the active layer and to suppress the optical confinement factor.

Figure 3:
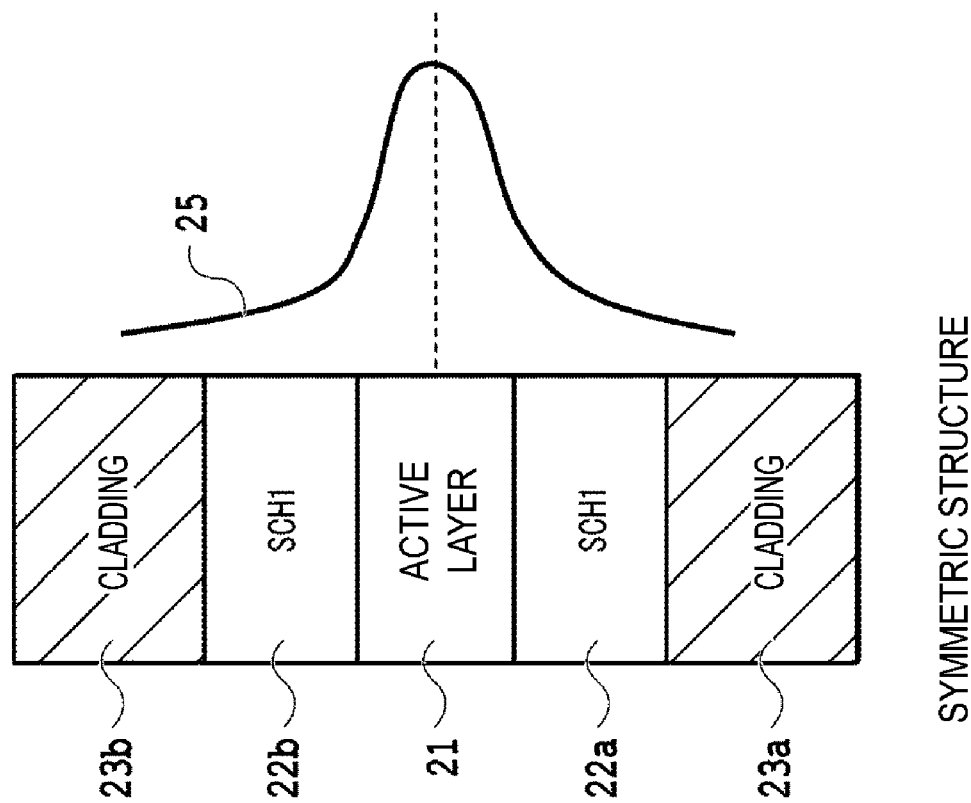
FIG. 3 is a diagram explaining a SCH structure which suppresses an optical confinement factor of the SOA.

FIG. 3 is a diagram illustrating an SCH structure in which the optical confinement factor is suppressed in the SOA. FIG. 3(a) schematically illustrates an optical waveguide having a symmetrical structure including SCH layers and illustrates a cross section perpendicular to a traveling direction of light. A lower cladding layer 23a, a lower SCH layer 22a, an active layer 21, an upper SCH layer 22b, and an upper cladding layer 23b are disposed vertically symmetrically with respect to the center of the active layer 21, and a peak position of an optical field 25 matches the center of the active layer 21. Thus, the light is efficiently confined in the active layer 21 of the waveguide. On the other hand, FIG. 3(b) illustrates an example of an optical waveguide having an asymmetrical layer structure, and a second SCH layer 24 is included under the active layer. Thus, a peak position of an optical field 26 is shifted downward and is moved away from the active layer 21 having an optical gain, so that the optical confinement factor can decrease, and as a result, the saturated optical output $P_{sat}$ can be increased.

Further, a scheme of reducing the number of quantum wells in the multi quantum well (MQW), which is the active layer, to reduce the optical confinement factor ($\Gamma$) of the active layer and increase the saturated optical output $P_{sat}$ is also used. In this case, the optical confinement factor ($\Gamma$) of the active layer decreases and the volume (dw) of the active layer also decreases at the same time, but as a result, when (dw/$\Gamma$) in Equation (1) can be increased, the saturated optical output $P_{sat}$ can be increased.

However, the DFB laser and the SOA of the AXEL have the same active layer (MQW) formed collectively in a single crystal growth process, and a layer structure of the SOA is constrained to the same structure as that of the DFB laser. Referring back to FIG. 2, the active layer 4 of the DFB laser 1 and the active layer 7 of the SOA 3 have the same structure, and the only difference is the presence or absence of a diffraction grating structure 5. Normally, a design guideline differs greatly between the DFB laser and the SOA, and in order to operate the DFB laser with high efficiency, the optical confinement factor F is designed to be large. This contradicts the above-described condition for increasing the saturated optical output $P_{sat}$ of the SOA. After all, because of constraints of the layer structure of the SOA 3 in the AXEL 20, the SOA 3 has a problem that the optical confinement factor F is maintained relatively high and the saturated optical output $P_{sat}$ is insufficient.

Figure 2:
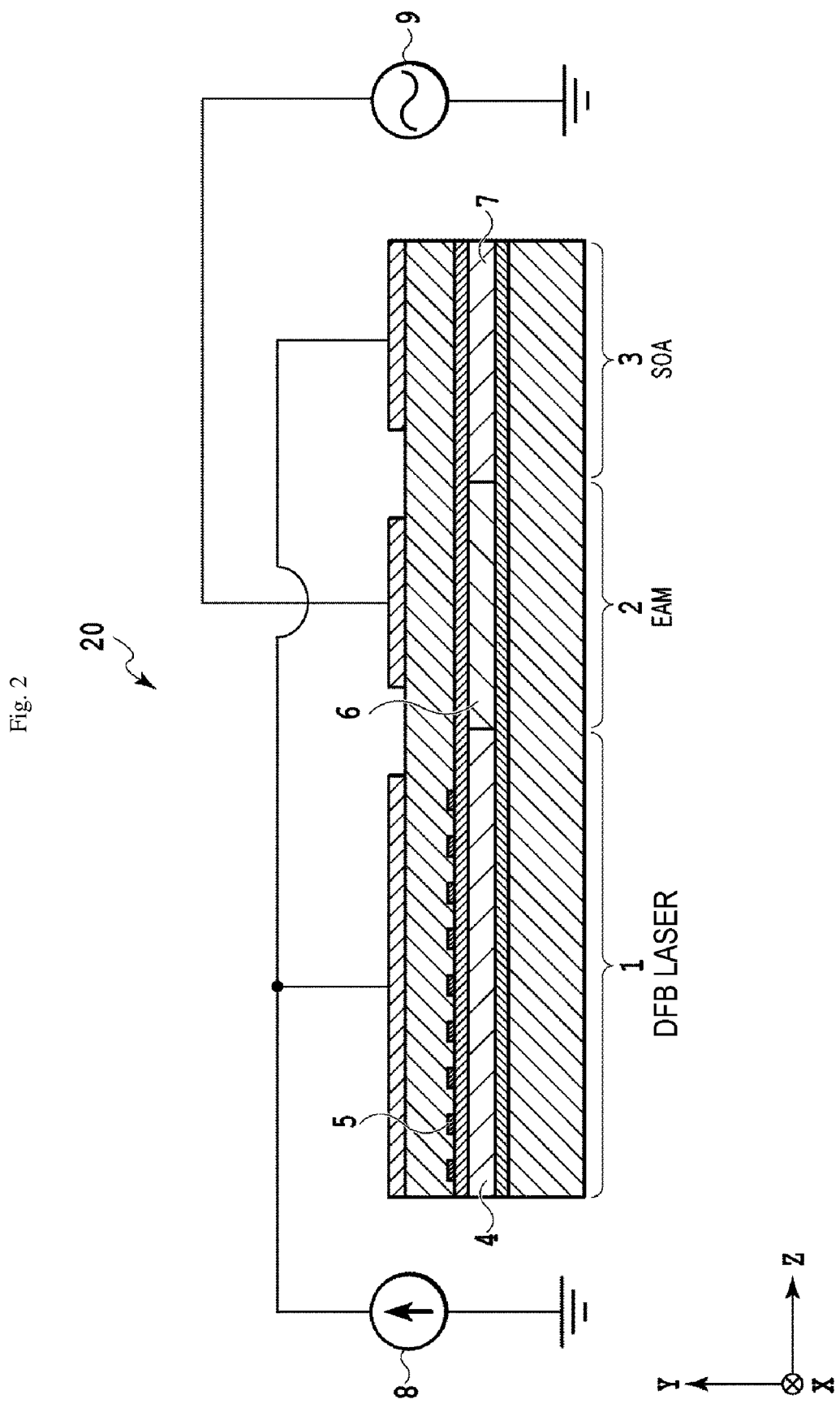
FIG. 2 is a diagram illustrating a schematic configuration of an AXEL in which an SOA is further integrated.

Another problem due to constraints on the layer structure of the SOA of the AXEL is deterioration of the optical signal waveform quality in the SOA due to the pattern effect. The pattern effect is known as a phenomenon in which distortion of a waveform changes depending on a configuration of a pulse train to be transmitted. As illustrated in FIG. 2, in the AXEL 20, the output light from the DFB laser 1 is modulated by the EA modulator 2, and then incident on and amplified by the SOA 3. The incident light on the SOA 3 is modulated and is signal light of which intensity changes with time. Carriers generated by current injection are consumed by optical amplification inside the SOA 3. When the signal light is incident on the SOA 3, the light intensity of the signal light constantly fluctuates, and thus an amount of carrier consumption in the SOA 3 also fluctuates with the light intensity. For example, when the light intensity of the incident signal light continues to be strong, carriers inside the SOA tend to be almost exhausted, and conversely, when the light intensity of the signal light continues to be weak, the internal carriers are not consumed and a carrier density increases. Thus, an optical gain of the SOA also fluctuates due to a random state change of the intensity of the signal light, which adversely affects the optical waveform quality. As will be described below, an influence of the pattern effect strongly occurs on the optical waveform, especially when the continuation of the same sign continues.

When light is subjected to intensity modulation (on-off-keying (OOK)) using a non-return-to-zero (NRZ) signal scheme, a state in which light intensity is strong is called a "1" level, a state in which the light intensity is weak is called a "0" level, and a behavior of the SOA when the same sign continues is considered. When bits at a "0" level continue, the light intensity of the signal light incident on the SOA continues to be weak and the amount of carrier consumption inside the SOA continues to be low, such that the carrier density is kept high. When the signal light changes to a "1" level after the signal light at a "0" level continues, the situation changes and the carriers accumulated in the SOA are consumed at once. In this case, it is easy for the optical signal waveform to greatly overshoot.

On the other hand, when signal light in which bits at a "1" level continue is incident on the SOA, the light intensity of the signal light is always kept strong, many carriers are consumed for optical amplification, and the optical gain of the SOA decreases. As a result, the "1" level of the optical signal waveform decreases and the quality of the optical signal waveform deteriorates. A pattern effect in such an SOA is particularly remarkable when the carrier density in the SOA is low. For the same reason, a significant effect appears when the SOA length is large. Further, because a substantial time when the same sign continues becomes long when a bit rate of a modulation signal is low, it is particularly easy for an influence of the pattern effect to appear.

Figure 4:
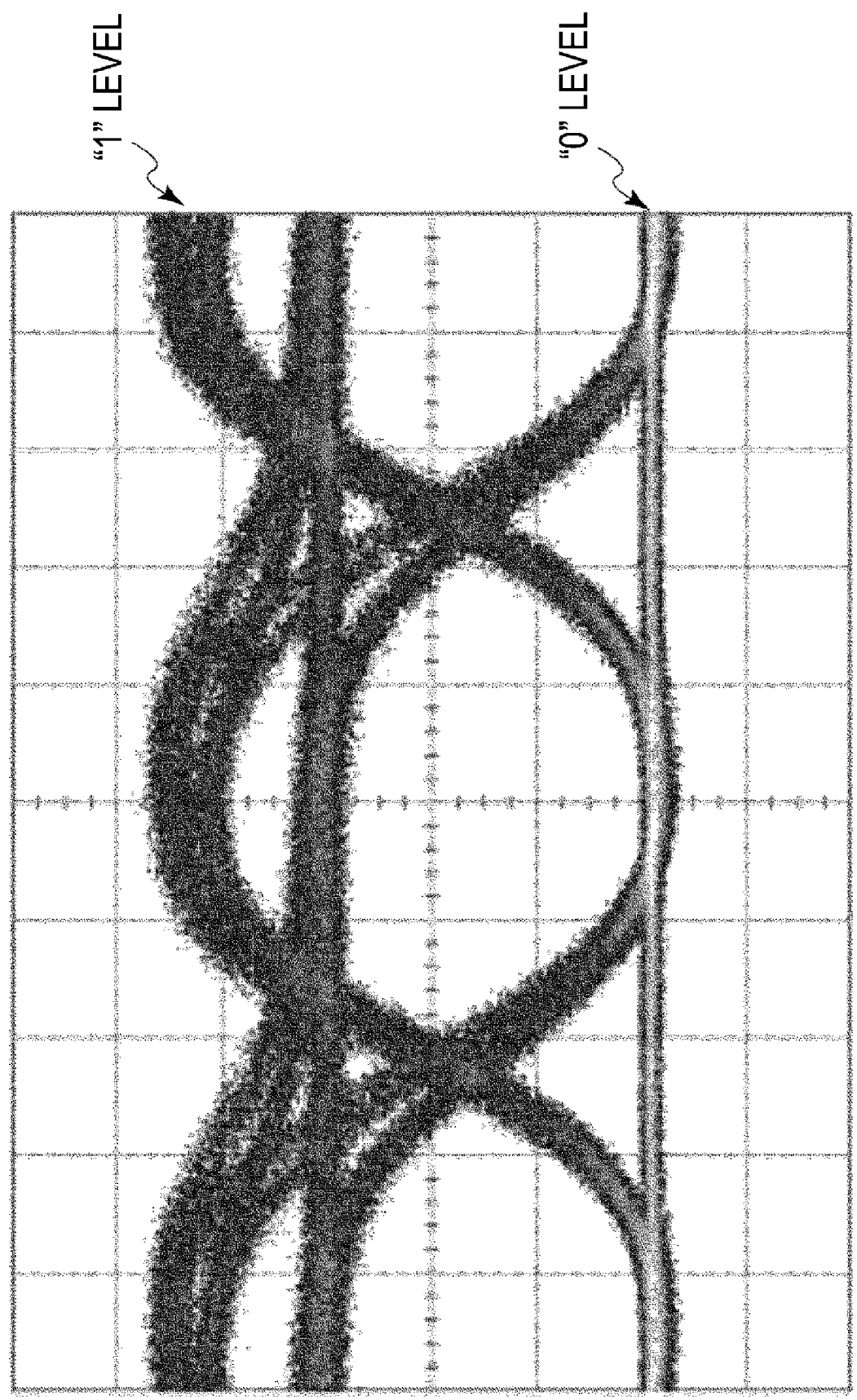
FIG. 4 is a diagram illustrating an NRZ optical waveform when a pattern effect occurs in the SOA.

FIG. 4 is a diagram illustrating an NRZ optical waveform when a pattern effect occurs in the SOA. In the AXEL 20 illustrated in FIG. 2, a 10 Gbit/s NRZ optical waveform (eye pattern) when the pattern effect occurs is illustrated. As described above, the "0" level at which the carrier density is kept high is stable at a substantially uniform level. On the other hand, it can be seen that the "1" level at which carriers are consumed becomes unstable due to a change in the carrier density inside the SOA depending on a state of an input signal, and a level of an optical signal intensity also varies. Deterioration of optical waveform quality as illustrated in FIG. 4 leads to deterioration of transmission quality and causes an inability to transmit an optical signal over a sufficient distance. It is necessary to increase the carrier density inside the SOA in order to suppress the pattern effect. However, as described above, the SOA 3 of the AXEL 20 is limited to an active layer (MQW) having the same layer structure as the DFB laser 1. It is difficult to adjust the carrier density inside the SOA, and the suppression of the pattern effect is limited. In an AXEL of the related art, an optical confinement factor and a current density of the DFB laser and the SOA cannot be set separately due to constraints of the layer structure of the SOA.

In the AXEL of the present disclosure, a waveguide structure having different core widths (waveguide widths) is adopted while using the same layer structure for the DFB laser and the SOA. Through the adoption of the waveguides with different core widths, the problems of insufficient saturated optical output or waveform deterioration due to the pattern effect in the related art can be solved and mitigated. A passive waveguide region having no optical gain is introduced in a part between the EA modulator and the SOA, and a tapered shape is used in the passive waveguide region so that the waveguide width is continuously changed. A configuration including a taper allows light to propagate at a low loss even when regions having different waveguide widths are formed from the DFB laser to the SOA. The waveguide structures of the DFB laser and SOA, also including an EA part, are all manufactured using a batch process. Thus, in the AXEL of the present disclosure, it is not necessary to change a manufacturing process of the AXEL of the related art, and the AXEL can be implemented simply by modifying a mask pattern at the time of forming the waveguide.

Prevention of deterioration of optical waveform quality and improvement of optical output characteristics are achieved by setting the waveguide width of the SOA according to guidelines to be described below. To increase the optical output in the SOA, the waveguide width of the SOA is designed to be larger than the waveguide width of the DFB laser so that a ratio (dw/Γ) of an active layer volume dw and the optical confinement factor Γ can be increased. As a result, the saturated optical output $P_{sat}$ of the SOA is expanded, and a high output can be obtained in the AXEL, as illustrated in Equation (1).

On the other hand, the waveguide width of the SOA is designed to be smaller than that of DFB laser in order to suppress the pattern effect in the SOA. It is necessary to suppress consumption of carriers and fluctuation thereof small when the signal light is incident on the SOA. The waveguide width of the SOA is designed to be smaller (narrower) than the waveguide width of the DFB laser, so that the volume of the active layer is reduced, and a relatively high carrier density can be achieved even with a small SOA driving current. Further, because the optical confinement factor is reduced by designing the waveguide width of the SOA to be narrow, the amount of carrier consumption by optical amplification is small, and the pattern effect due to carrier fluctuation is suppressed.

Figure 5:
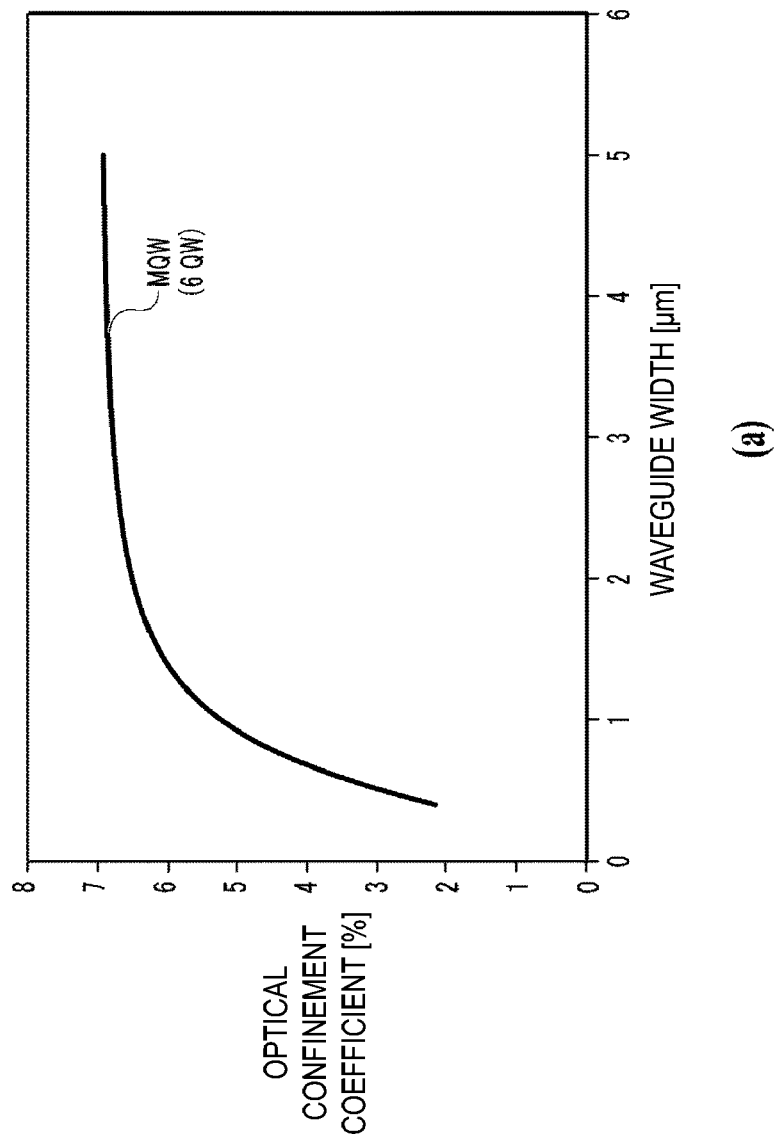
FIG. 5 is a diagram illustrating a change in the optical confinement factor in a case in which a waveguide width of the SOA has been changed.
Figure 5:
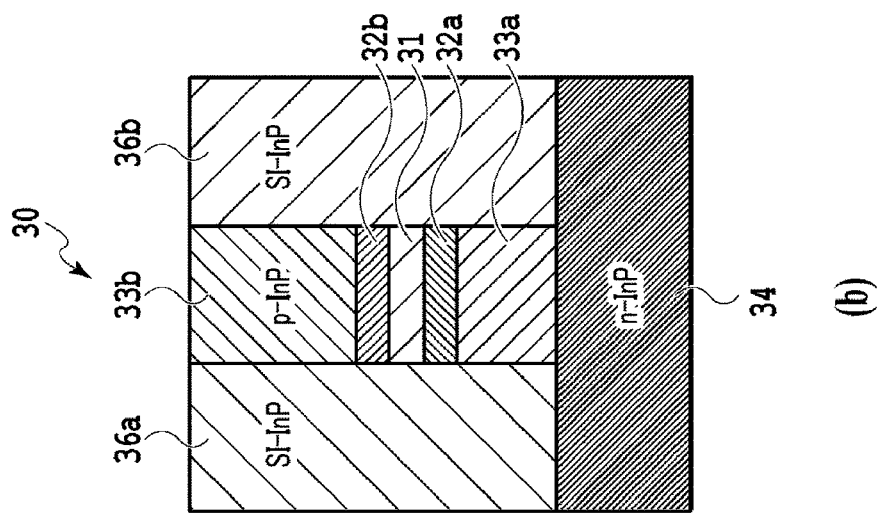

FIG. 5 is a diagram illustrating a change in the optical confinement factor in a case in which the waveguide width of the SOA has been changed. FIG. 5(a) illustrates a calculation result of the optical confinement factor of the active layer (MQW) in a case in which the waveguide width of the SOA has been changed. A horizontal axis indicates a width (μm) of the SOA waveguide, and a vertical axis indicates the optical confinement factor (%). Here, as a typical SOA structure, a buried heterostructure in which an active layer (MQW) with six quantum wells having an optical gain at a 1.3 μm band is provided, and both sides of the waveguide are buried with semi-insulating InP as current block layers was assumed and calculation was performed. FIG. 5(b) illustrates a cross-sectional view of the waveguide of the SOA for which the optical confinement factor was calculated. A lower cladding layer 33a, a lower SCH layer 32a, an active layer 31, an upper SCH layer 32b, and an upper cladding layer 33b are sequentially configured on an n-InP substrate 34. Semi-insulating (SI) InP buried layers 36a and 36b are formed beside the waveguide. The relationship between the waveguide width and the optical confinement factor described with reference to FIG. 5 holds for a light source having a wide wavelength band regardless of a specific layer structure. It should be noted that effects to be described below in the AXEL of the present disclosure are not limited to a specific wavelength band, the number of quantum wells of the SOA, and the waveguide structure in the examples, but are solely due to optimization of the waveguide width of the DFB laser and SOA.

As is clear from FIG. 5(a), the optical confinement factor increases as the waveguide width in the SOA increases. When the waveguide width is 2 μm or less, the optical confinement factor changes sharply. On the other hand, when the waveguide width is 2 μm or more, the optical confinement factor is substantially saturated and there is no significant change. In a typical DFB laser having a buried heterostructure at a wavelength in a 1.3 μm band, a waveguide width of about 1.5 μm is adopted, and the optical confinement factor is about 6%.

Figure 6:
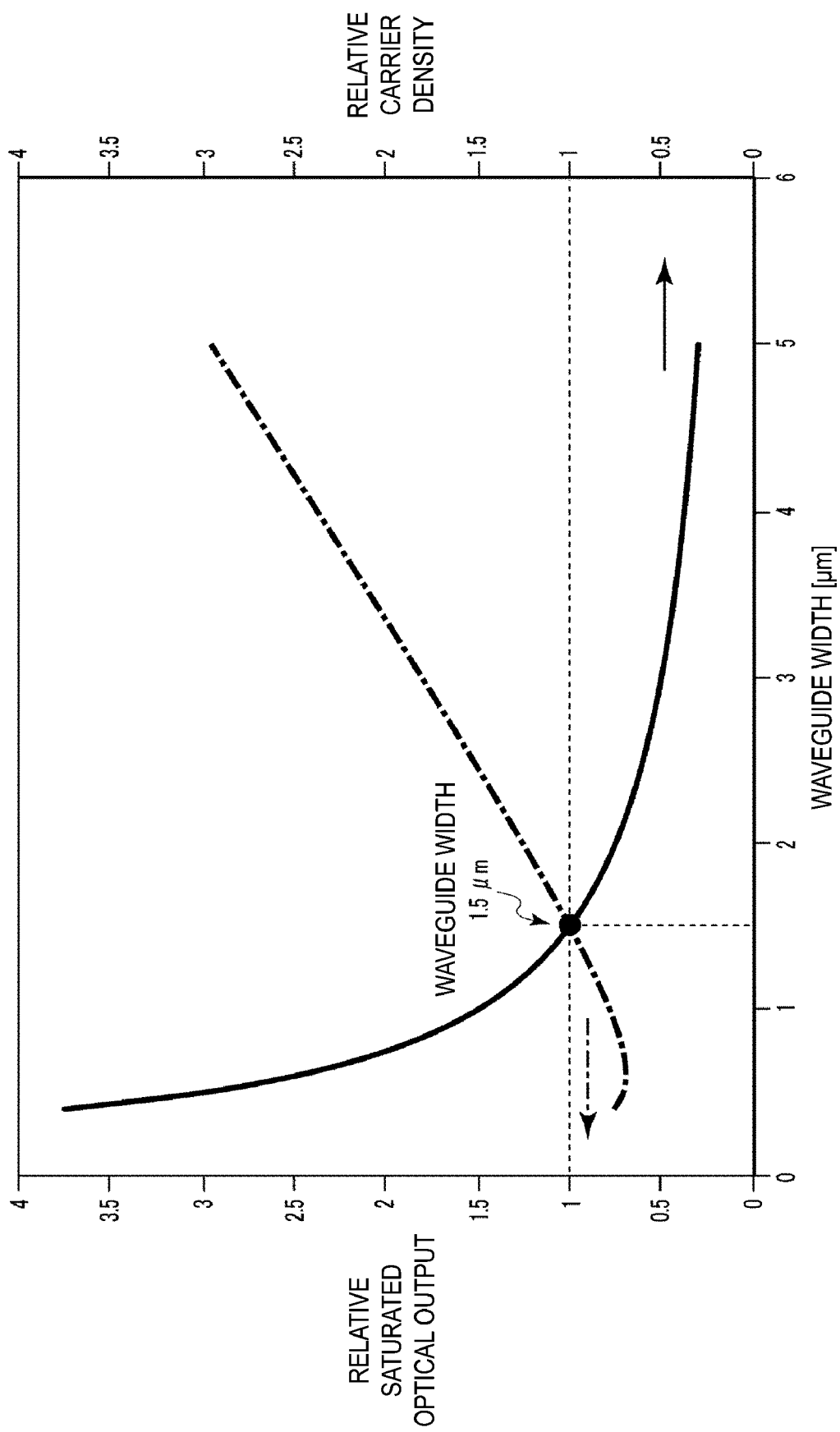
FIG. 6 is a diagram illustrating a total result of a saturated optical output relative value with respect to a waveguide width of the SOA.

FIG. 6 is a diagram illustrating a total result of a relative value of the saturated optical output with respect to the waveguide width of the SOA. A horizontal axis indicates the width (μm) of the waveguide in the SOA, a left vertical axis indicates a relative saturated optical output (ratio) based on a case in which the waveguide width is 1.5 μm, and a right vertical axis indicates a relative carrier density (ratio) when operation is performed with the same driving current. As described above, the saturated optical output is expressed by Equation (1) and depends on the value (dw/Γ) obtained by dividing the volume dw of the active layer by the optical confinement factor F. When the waveguide width w is expanded, the optical confinement factor F also increases, but as illustrated in FIG. 5(a), the optical confinement factor F is substantially saturated when the waveguide width is 2 μm or more. However, because the increase in the active layer volume (dw) mainly contributes to the saturated optical output rather than the waveguide width w, it is possible to improve the saturated optical output even when the waveguide width is in a range of 1.5 μm or more as indicated by an alternate long and short dash line in FIG. 6.

On the other hand, in terms of suppressing of the pattern effect, the waveguide width of the SOA is made narrower than the waveguide width of the DFB laser so that a higher effect is exhibited. As indicated by a solid line in FIG. 6, the carrier density increases in a range in which the waveguide width is 1.5 μm or less. The carrier density corresponds to a reciprocal of a waveguide width ratio, and it is effective to reduce the optical confinement factor in order to suppress abrupt fluctuations of carriers when light is incident on the SOA. As is clear from FIG. 5(a), the optical confinement factor in the SOA can be reduced by designing the waveguide width w of the SOA to be smaller than the waveguide width of the DFB laser. Further, as illustrated in FIG. 6, the waveguide width w is designed to be small so that the carrier density can be relatively increased. In this respect, narrowing the waveguide width of the SOA is effective in suppressing the pattern effect.

Hereinafter, examples of the AXEL of the present disclosure will be further described based on the above-described design guidelines for the waveguide width in the SOA.

Example 1

In the present example, in an optical transmitter capable of generating a modulation signal of 25 Gbit/s, an optical transmitter in which a modulated optical output is increased to 8 dBm or more will be disclosed. An output of the optical transmitter in the current optical transmission device at the time of modulation is about 0 to +3 dBm. The present example aimed at achievement of an optical transmitter in which the modulated optical output is increased to 8 dBm or more in order to obtain a sufficient margin in a link loss budget in which long-distance transmission of 40 km or more has been assumed. Although examples of optical transmitters using an AXEL will be described hereinafter, the design guideline of the waveguide width in the SOA of the present disclosure can also be obviously applied to other integrated devices including at least a DFB laser, an EA modulator, and an SOA. A wavelength band of the DFB laser is also not limited to a wavelength band in the following examples.

Figure 7:
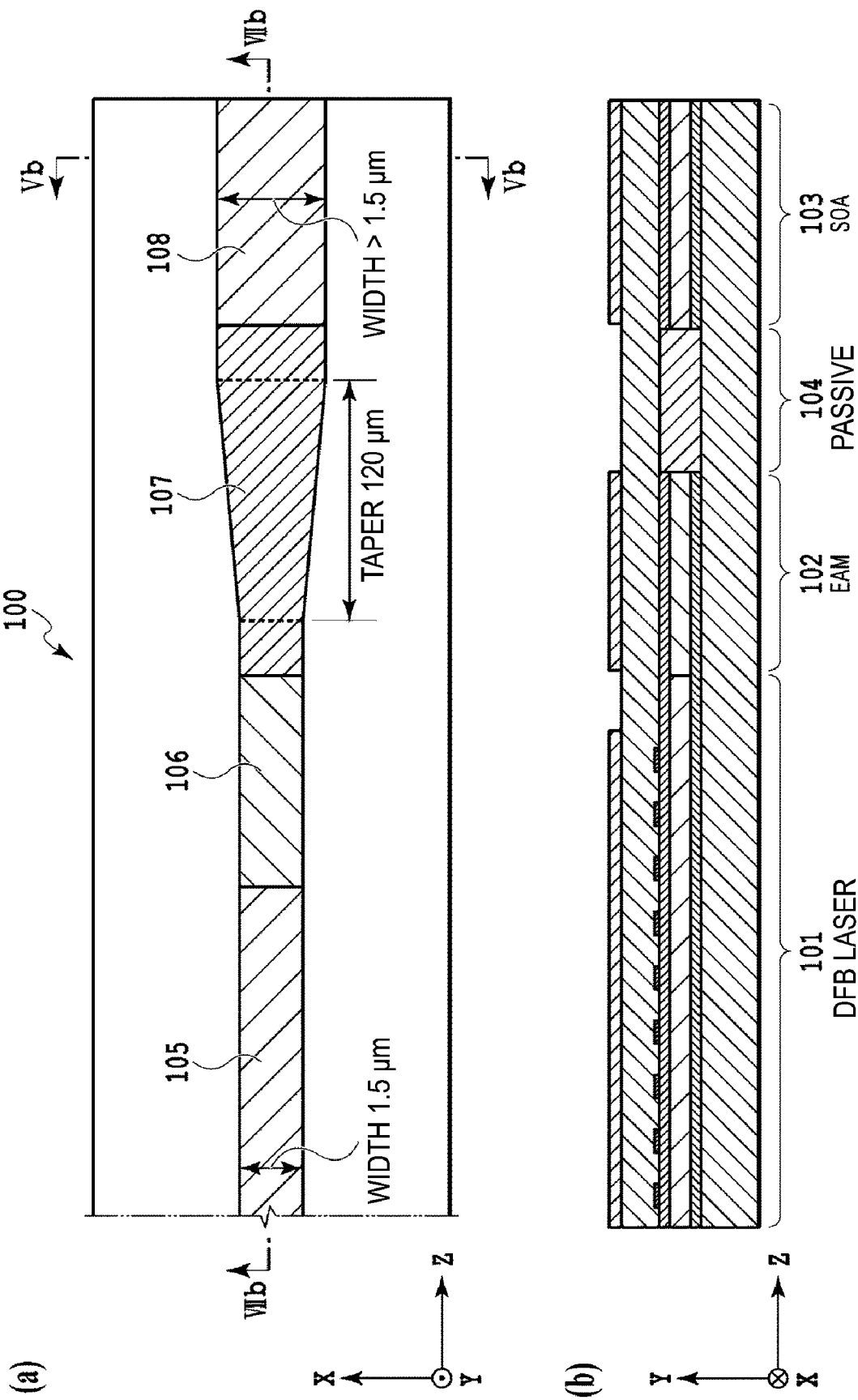
FIG. 7 is a diagram illustrating a waveguide structure in an optical transmitter of Example 1.

FIG. 7 is a diagram illustrating a waveguide structure of the optical transmitter according to the AXEL of Example 1. FIG. 7(a) is a diagram illustrating a cross section (x-z plane) passing through the center of a waveguide of an optical transmitter 100 in a thickness direction and in parallel to a substrate plane, and FIG. 7(b) is a diagram illustrating a cross section (y-z plane) passing through the center of the waveguide in a width direction and perpendicular to the substrate plane. A scale in a z-axis direction does not match between FIGS. 7(a) and 7(b), and FIG. 7(a) illustrates a part in a waveguide length direction by slightly enlarging the z-direction, compared to FIG. 7(b). Further, in FIG. 7(a), all elements above the cross section are removed.

As illustrated in FIG. 7(b), the optical transmitter 100 of the present example is a monolithic integrated element in which a DFB laser 101, an EA modulator 102, a passive region 104, and an SOA 103 are integrated in that order. The DFB laser 101 has a length of 300 μm, an EA modulator in front of the DFB laser 101 has a length of 150 μm, and a passive region 104 having a tapered structure with a length of 120 μm is provided between the EA modulator 102 and the SOA 103. As illustrated in FIG. 7(a), a waveguide 106 of the EA modulator and a waveguide 108 of the SOA 103 having different waveguide widths are optically coupled by a tapered waveguide 107 at a low loss.

Here, a process of manufacturing the integrated circuit (AXEL) of the optical transmitter 100 will be described. For element manufacture, an initial substrate in which a lower SCH layer, an active layer (MQW1) of a multi quantum well layer, and an upper SCH layer were sequentially grown on an n-InP substrate was used. Here, the multi quantum well includes six quantum well layers and has an optical gain in an oscillation wavelength of a 1.3 μm band. The initial substrate including each of the above-described layers has a structure optimized for high-efficiency operation of the DFB laser 101. The initial substrate is used because the initial substrate is widely available, and each of the above-described layers may be manufactured without using the initial substrate.

As an integrated circuit manufacture process, first, the DFB laser 101 and a part serving as the SOA region 103 were left, other active layers are selectively etched, and a multi quantum well layer (MQW2) for the EA modulator 102 was grown by butt joint regrowth. Then, a boundary part between the SOA region 103 and the EA modulator 102 was selectively etched, and butt joint regrowth was performed so that a bulk semiconductor that would be the core layer of the passive region 104 was grown. Subsequently, a diffraction grating was formed in a region of the DFB laser to operate in a 1.3 µm oscillation wavelength band.

Thereafter, a p-InP cladding layer and a contact layer were grown on the entire surface of the element by regrowth. A thickness of the cladding layer was 2.0 µm in the present example so that a field of the light is not hang over an electrode region. A mesa structure was formed by etching. In this process, any pattern is formed through a photolithography process and a waveguide width of each region is formed through a batch etching process. Even when different waveguide widths are designed in the DFB laser and the SOA as in the optical transmitter according to the AXEL of the present disclosure, the above-described manufacturing process is the same as that in the related art, and manufacture can be performed without increasing a process load or cost.

Then, Fe-doped semi-insulating InP layers were formed on both sides of a mesa by burying and regrowth. Subsequently, the contact layers between the respective regions were removed by wet etching in order to electrically separate the respective regions of the DFB laser, the EA modulator, and the SOA. Then, a P-side electrode for injecting a current through the contact layer on each region of an upper surface of the InP substrate was formed. Thereafter, a back surface of the InP substrate was polished up to about 150 µm, an electrode was formed on the back surface of the substrate, and a process on a semiconductor wafer was completed.

Although not illustrated in FIG. 7, in each element on the wafer, an anti-reflective coating (AR) is performed on a front end face adjacent to the SOA 103 and highly reflective coating (HR) is performed on a rear end face opposite to the front end face, after an end face from which light is emitted is cut out. In the optical transmitter 100 of the present example, a core layer structure formed in the initial substrate remains as it is in the SOA 103 and is the same as a layer structure of the DFB laser 101. The only difference in layer structure between the DFB laser 101 and the SOA 103 is the presence or absence of a diffraction grating. In the optical transmitter 100 of the present example, a common layer structure is used for the DFB laser 101 and the SOA 103, such that the number of regrowths is suppressed in a structure in which a plurality of functional regions have been integrated, resulting in manufacture at low cost.

The waveguide of the optical transmitter 100 of the present example has a laminated structure including a core layer (a total layer thickness of 200 nm) formed of an active layer of a multi quantum well layer, upper and lower SCH layers, and InP cladding layers with the core layer vertically sandwiched therebetween, in a vertical direction of a cavity. In a horizontal direction, the waveguide has a buried heterostructure in which InP layers are formed on both sides of the mesa. For a waveguide width in the DFB laser region 101, 1.5 µm at which the laser operates most stably was adopted. Further, the same 1.5 µm was adopted in the EA modulator 102. For the SOA, in order to confirm effects of use of a waveguide having a width different from that of the DFB laser in the optical transmitter of the present disclosure, AXELs having three types of waveguide widths of 1.5, 1.7, and 2.4 µm with respect to the SOA width were manufactured and operating characteristics were compared. For the SOA length, AXELs having seven different SOA lengths in a range of 100 µm to 250 µm were manufactured. In all the AXELs, the DFB laser and EA modulator have the same layer structure, and the only difference is the width and length of the waveguide in the SOA region. Further, an AXEL having an SOA width of 1.5 µm has no tapered structure between the EA modulator and the SOA as illustrated in FIG. 7 because the DFB laser, the EA modulator, and the SOA all have a uniform waveguide width.

Modulation characteristics of 25 Gbit/s were evaluated using manufactured elements. As a modulation signal, a pseudo-random binary sequence PRBS$2^{31}$–1 in NRZ format was used. In all the manufactured AXELs, a current value of the laser was set to 80 mA, a voltage applied to the EA modulator was set to –1.5 V for comparison. For the driving current of the SOA, an SOA current was set to 70 mA with reference to an AXEL having an SOA with a waveguide width of 1.5 µm and a length of 150 µm. Based on this current value, a current value proportional to an area (x-z plane) of the active region of the SOA was set for all other AXELs. That is, all the SOAs were driven with the same current density, and operating characteristics were compared.

Figure 8:
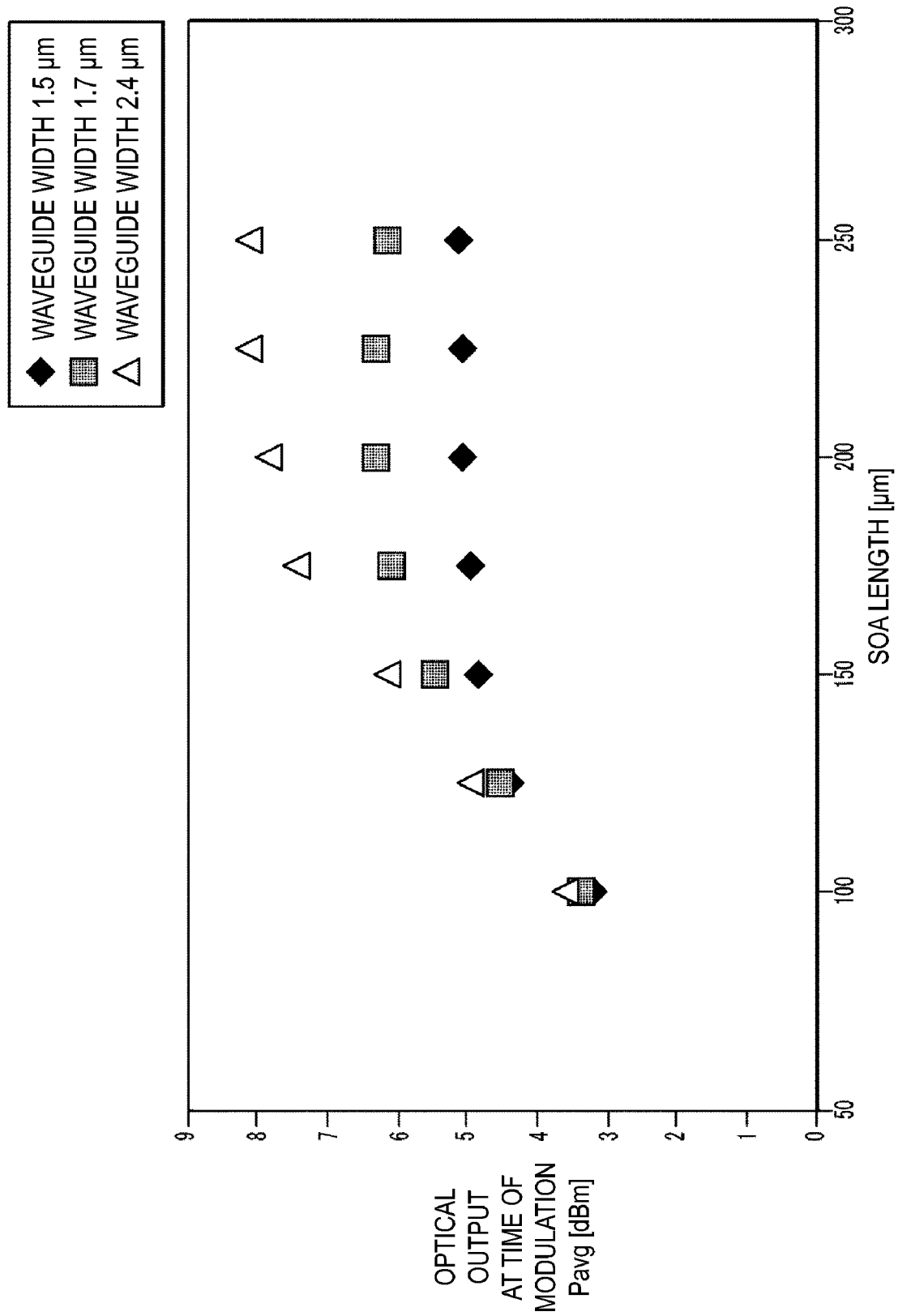
FIG. 8 is a diagram illustrating a relationship between a waveguide width and length of the SOA and an optical output at the time of modulation.

FIG. 8 is a diagram illustrating a relationship between the waveguide width and length of the SOA and the optical output at the time of modulation. Three types of SOA waveguide widths are set as parameters, a length (µm) of the SOA is indicated on a horizontal axis, and an optical output $P_{avg}$ (dBm) at the time of modulation is indicated on a vertical axis. For the optical output at the time of modulation, a light intensity at the time of fiber coupling using a standard single-mode fiber with a lens is plotted. As is clear from FIG. 8, it can be seen that the optical output intensity at the time of modulation increases as the waveguide width of the SOA increases. In a case in which the waveguide width of the SOA is 1.5 µm, the optical output is saturated when the SOA length is about 150 µm, and even when the SOA is further lengthened, the output cannot be increased. On the other hand, as the waveguide width is increased to 1.7 µm and 2.4 µm, the optical output is hard to saturate even in a range in which the SOA length is larger, and a higher optical output can be obtained.

When the SOA length is short and is about 100 µm, the output at the time of modulation hardly changes at any waveguide width. This corresponds to the fact that, as illustrated in FIG. 5(a), the optical confinement factor hardly changes when the waveguide width is 1.5 µm or more, and a mode gain of light propagating in the SOA does not change much. On the other hand, when the SOA length is larger than a certain value, it is possible to increase the saturated optical output by expanding the waveguide width, and to increase the optical output at the time of modulation even in the case of a relatively long SOA, as illustrated in FIG. 6. In an AXEL having an SOA having a waveguide width of 2.4 µm and a length of 225 µm, the optical output at the time of modulation reached 8.1 dBm, and a sufficient optical output was confirmed.

Figure 9:
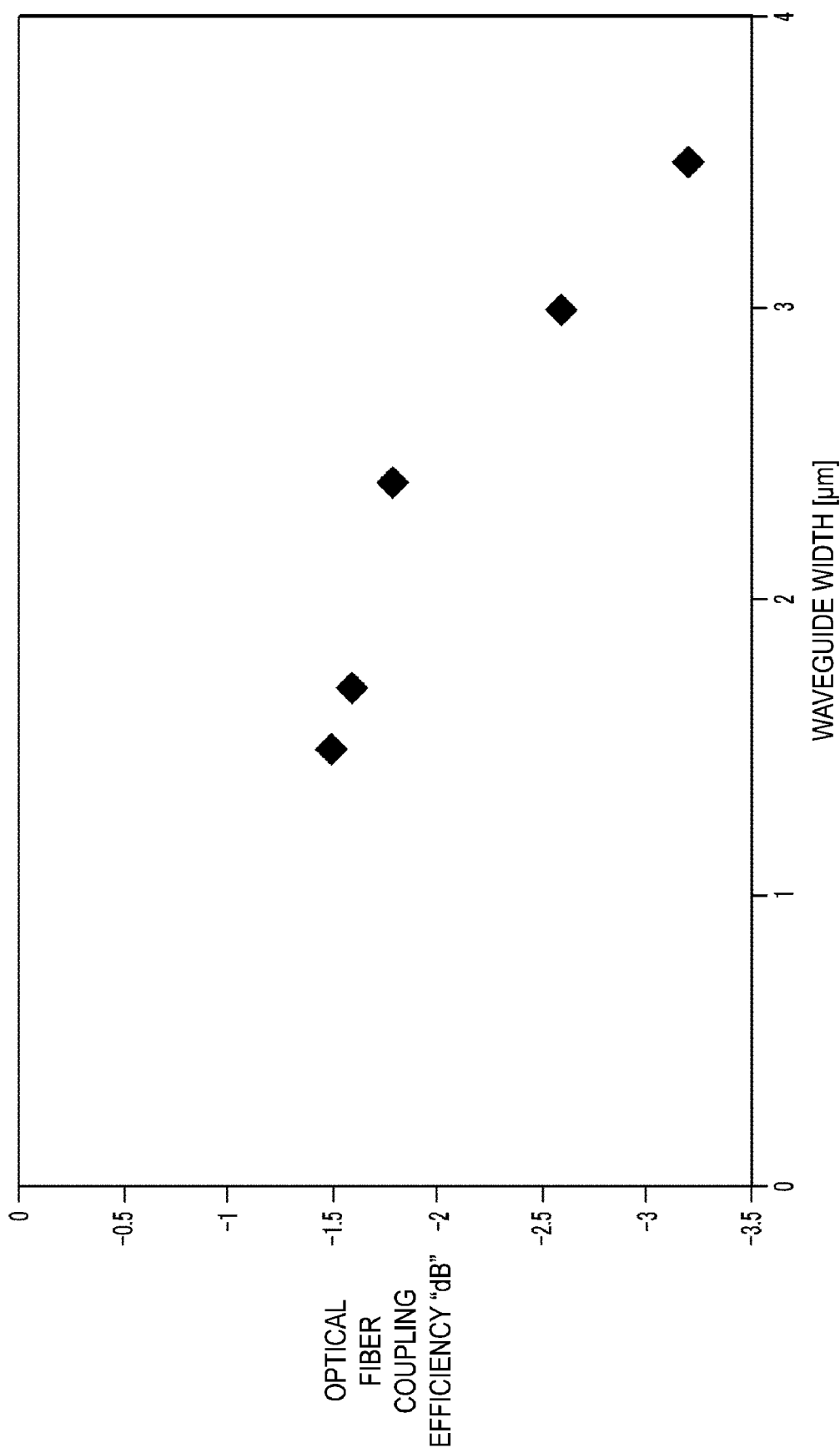
FIG. 9 is a diagram illustrating optical coupling efficiency with a fiber in the optical transmitter of Example 1.

FIG. 9 is a diagram illustrating optical coupling efficiency with a fiber in the optical transmitter of Example 1. A waveguide width (horizontal axis) and optical fiber coupling efficiency (vertical axis) of the SOA when optical outputs are coupled using a standard single-mode fiber with a lens in the optical transmitter of the AXEL manufactured under each condition are shown. Here, a range of the waveguide width of the SOA is further expanded and an SOA having a waveguide width up to 3.5 µm is evaluated. As is clear from FIG. 9, the optical fiber coupling efficiency decreases as the SOA width increases. This decrease in optical fiber coupling efficiency is due to an increase in coupling loss caused by the lens as a field of light waveguiding through the waveguide of the SOA changes from a circular shape to an elliptical shape. When this coupling loss is also taken into consideration, the waveguide width of the SOA set to a range of 2.5

µm or less in which the decrease in coupling efficiency is relatively small in FIG. 9 becomes an upper limit for increasing the output of the AXEL. Further expansion of the waveguide width has a greater demerit due to an increase in coupling loss with the optical fiber than an increase in optical output.

According to results of FIGS. 8 and 9, when the waveguide width of the DFB laser is designed to be 1.5 to 2.0 µm, and the increase in the saturated optical output due to expansion of the waveguide width of the SOA and a loss at the time of lens coupling are taken into consideration, the optical transmitter of the present disclosure exhibits the most effects when the waveguide width of the SOA is 1.5 µm or more and 2.5 µm or less.

In an AXEL having an SOA with a waveguide width of 2.4 µm and a length of 225 µm, a dynamic extinction ratio was obtained from an optical output difference between a "0" level and a "1" level of an evaluated eye pattern waveform. A dynamic extinction ratio of 9.1 dB was obtained, and waveform quality of an optical signal was also obtained at a sufficient level. Finally, the current value of the laser was set to 80 mA, the voltage applied to the EA modulator was set to −1.5 V, the SOA current was set to 168 mA, and transmission characteristics of 40 km of a single-mode fiber were evaluated. This is the same driving condition as in the measurement for obtaining the relationship between the waveguide width and length of the SOA and the optical output at the time of modulation illustrated in FIG. 8. As a result, error-free transmission with a bit error rate of less than $10^{-12}$ could be confirmed. As described in detail above, the waveguide width of the SOA of the AXEL was expanded beyond the waveguide width of the DFB laser and optimized, and effects of sufficiently increasing the optical output was confirmed.

In the present example, increasing the output of the optical transmitter is focused on, but in the next example, an example in which the influence of the pattern effect is suppressed and the quality of the signal waveform is improved is shown.

Example 2

Figure 10:
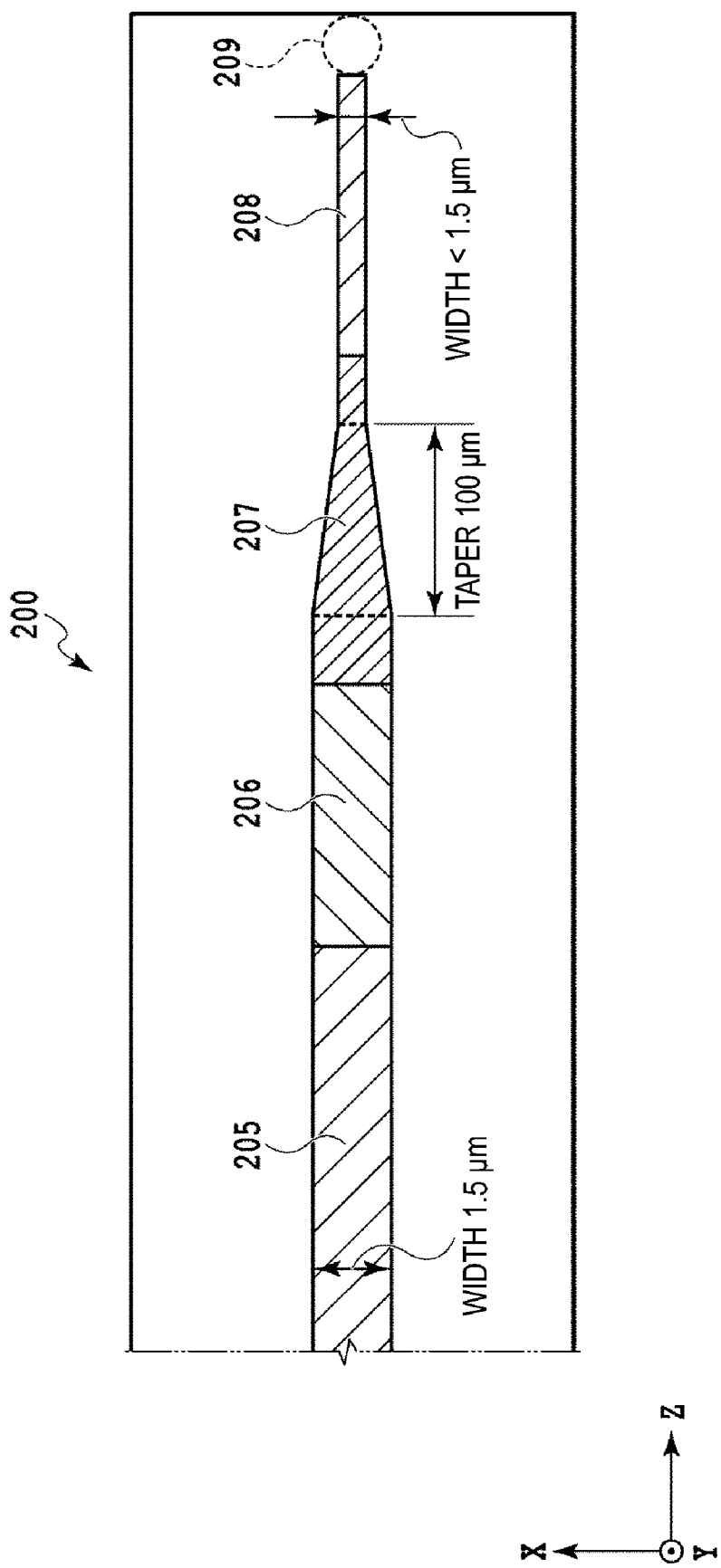
FIG. 10 is a diagram illustrating a waveguide structure in an optical transmitter of Example 2.

FIG. 10 is a diagram illustrating a waveguide structure of an optical transmitter according to an AXEL of Example 2. FIG. 10 is a diagram illustrating a cross section (x-z plane) of an optical transmitter 200 passing through the center of a waveguide in a thickness direction and being in parallel to a substrate plane. Because a configuration of a cross section perpendicular to the substrate plane is the same as that of Example 1 except for the vicinity of an emission end part on the SOA, which will be described below, only a top view is illustrated in FIG. 10. A DFB laser on the left side of FIG. 10 is partially omitted, and a part above the cross section is removed.

The optical transmitter 200 of the present example is a monolithic integrated element in which a DFB laser, an EA modulator, a passive region, and an SOA are integrated in this order, as in Example 1. A waveguide 205 of the DFB laser has a length of 300 µm, a waveguide 206 of the EA modulator in front of the waveguide 205 has a length of 150 µm, and a waveguide 208 of the SOA has a length of 100 µm. A tapered structure 207 having a length of 100 µm is provided between the EA modulator and the SOA, and the EA modulator and the SOA having different waveguide widths are optically coupled at a low loss. The taper 207 has a structure in which a width gradually narrows in a light propagation direction, unlike the case of Example 1.

In the present example, an optical transmitter capable of generating a 10 Gbit/s modulation signal in a 1.57 µm wavelength band, which is an optical transmitter that suppresses the pattern effect in the SOA and achieves a high-quality optical waveform and high output characteristics will be disclosed. In a modulation signal having a modulation rate of 10 Gbit/s, because a modulation rate rate is lower than the case of 25 Gbit/s in Example 1, a period of the same sign continuity is longer and the influence of the pattern effect of the SOA becomes large. Thus, in the optical transmitter according to the AXEL of the present example, a waveguide width narrower than that of the waveguide of the DFB laser is adopted in the SOA so that a driving current density in the SOA is increased and a high-quality optical waveform is achieved.

A manufacturing process of the integrated circuit (AXEL) of the optical transmitter 200 of the present example is substantially the same as the process of Example 1 described above. As the only difference, a window structure 209 that suppresses reflection on a chip end face is formed using bulk InP at a boundary between the SOA waveguide 208 and a light emission end of the chip, as illustrated in FIG. 10. In the optical transmitter 200 of the present example, the optimization of the waveguide width of the SOA for reducing the influence of the pattern effect is performed only by modifying a mask pattern for waveguide formation without changing an AXEL manufacture process in the related art. In the present example, a plurality of AXELs having different waveguide widths of SOAs were manufactured and quality of optical waveforms thereof was evaluated. The waveguide widths of the DFB lasers and the EA modulators of all the manufactured AXELs were 1.5 µm, and had the same layer structure. The layer structure of the SOA was the same as that of the DFB laser, and the lengths of all the SOAs were 100 µm and constant values. In the present example, five AXELs having the same waveguide width and layer structure were manufactured for each condition of changing only the waveguide width of SOA, and each element was evaluated. By manufacturing a plurality of AXELs under each condition of different waveguide widths of the SOA and measuring the optical outputs, the variations in characteristic values of the devices were also evaluated.

Figure 11:
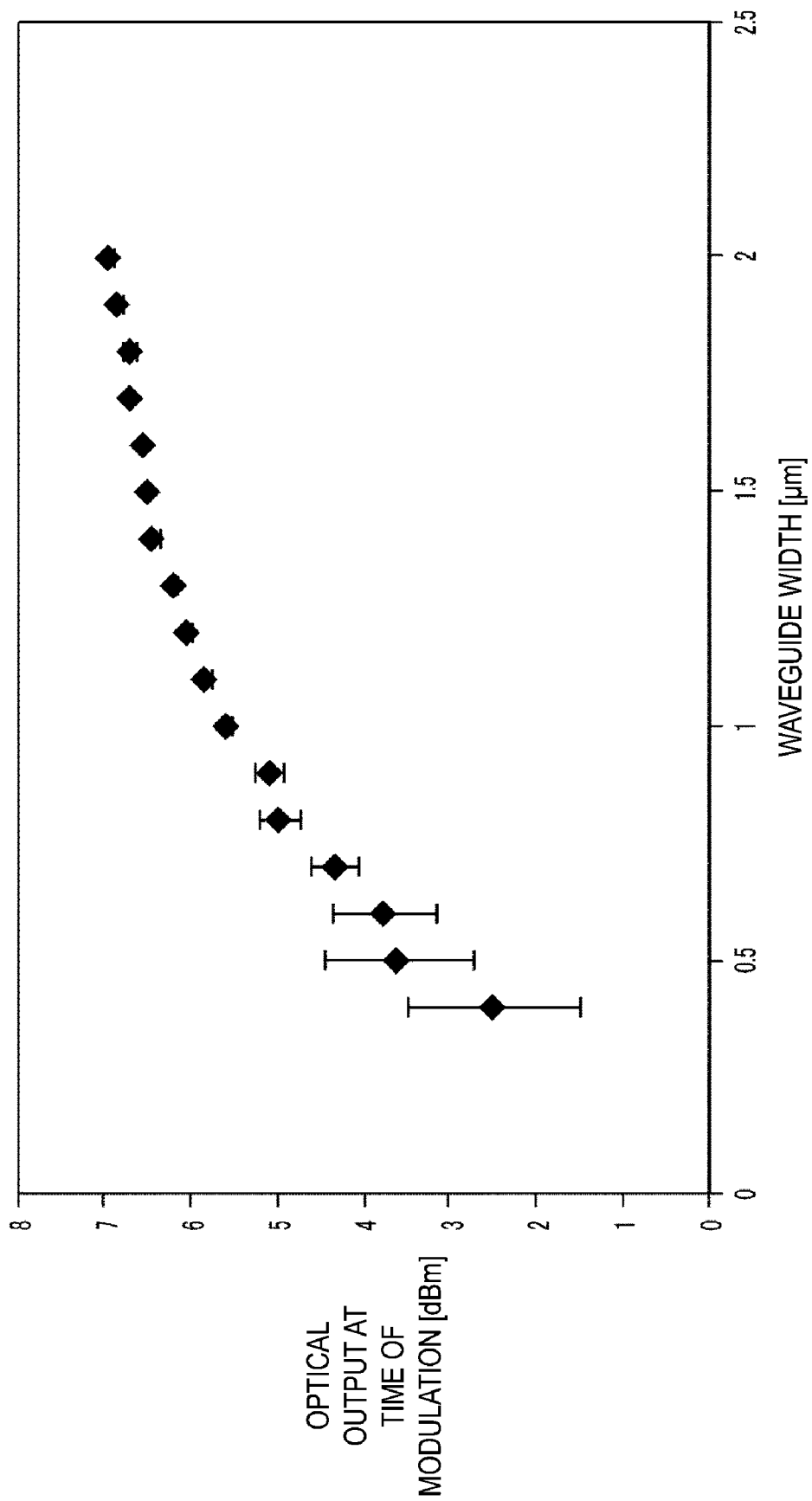
FIG. 11 is a diagram illustrating a relationship between an SOA waveguide width and an optical output at the time of modulation in Example 2.

FIG. 11 is a diagram illustrating the relationship between the SOA waveguide width and the optical output at the time of modulation in the optical transmitter of Example 2. For driving conditions of the optical transmitter, a current value of an element having a waveguide width of 1.5 µm of an SOA was set to 60 mA, and driving was performed based on this current value so that SOAs of all manufactured elements had the same current density (x-z plane). In all AXELs, the current value of the DFB laser was set to 80 mA, and the voltage applied to the EA modulator was set to −1.5 V. As a modulation signal, a pseudo-random binary sequence $PRBS2^{31}-1$ in NRZ format was used. The optical output was a light intensity at the time of fiber coupling in which a standard single-mode fiber with a lens has been used, as in Example 1.

As is clear from FIG. 11, it can be seen that the optical output at the time of modulation decreases as the waveguide width of the SOA reduces. This is because the optical confinement factor of the quantum well is decreased due to a reduction in the waveguide width as described with reference to FIG. 5(a). What should be noted in the relationship between the waveguide width and the optical output at the time of modulation in FIG. 11 is the variation in the optical output indicated by an error bar (error range) observed in a range in which the waveguide width is 1.0 µm or less. A variation range of the optical output also rapidly increases at the same time as the waveguide width of the SOA reduces, and particularly, the variation is remarkable when the waveguide width is 0.8 μm or less. This is because a variation in the waveguide width itself that occurs when the waveguide pattern is exposed appears due to the reduction in the waveguide width, which is an unavoidable variation in a current manufacturing process.

Considering the instability of the optical output at the time of modulation due to the variation of the waveguide width itself in FIG. 11, it can be seen that there is a limit to the reduction of the SOA waveguide width for suppressing the pattern effect. Considering that a waveguide width of a typical DFB laser used for optical communication is 1.5 to 2.0 μm, the present example can exhibit the most effects in a range in which the waveguide width of the SOA is 0.8 μm or more and 2.0 μm or less. Finally, optical waveform quality was compared between an SOA having a waveguide width of the SOA of 1.0 μm and an AXEL in which an SOA having a waveguide width of 1.5 μm, which is the same as that of a DFB laser and an EA modulator of the related art, has been adopted.

Figure 12:
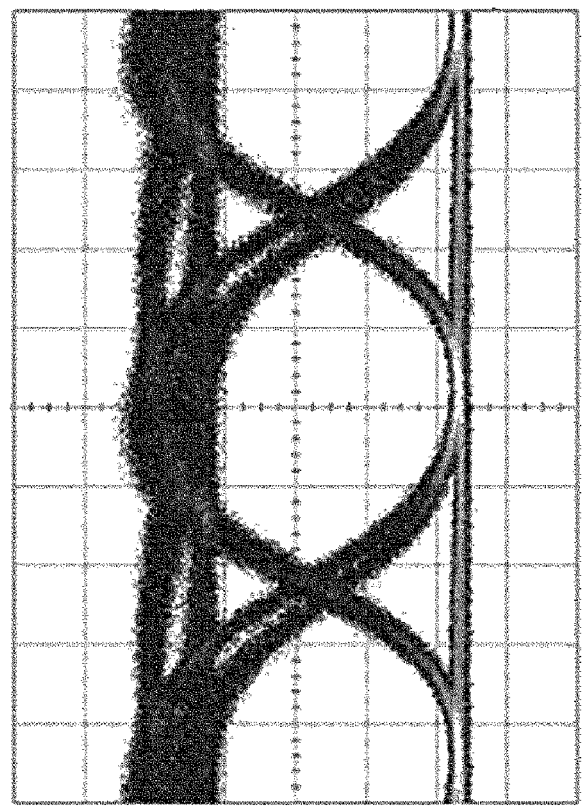
FIG. 12 is a diagram illustrating improvement of an eye pattern in the optical transmitter of Example 2.
Figure 12:
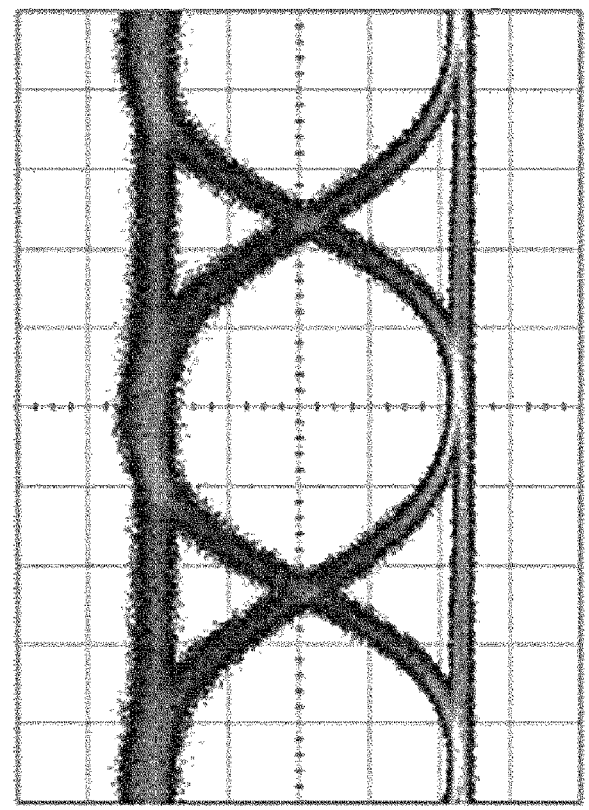

FIG. 12 is a diagram illustrating improvement of an eye pattern in the optical transmitter of Example 2. FIG. 12(a) illustrates an eye pattern in a case in which the waveguide width of the SOA is 1.0 μm and is smaller than that of the DFB laser or the like in the present example. FIG. 12(b) illustrates an eye pattern in a case in which all waveguide widths from the DFB laser to the SOA of the related art are 1.5 μm. Driving conditions of the DFB laser and the EA modulator and the modulation signal are the same as the above-described conditions. The same current value of 70 mA was applied to the SOAs of the two AXELs. Thus, the eye pattern having an SOA width of 1.0 μm illustrated in FIG. 12(a) was operating at a higher current density.

As is clear from FIG. 12, the waveguide width of the SOA is reduced so that a variation width of the "1" level is narrowed, a clear opening (eye) is obtained, and waveform quality of the eye pattern is greatly improved. The optical output at the time of modulation in this case is 6.4 dBm for an element having an SOA width of 1.5 μm, and 6.1 dBm for an element having an SOA width of 1.0 μm, which are substantially the same level, and favorable in terms of optical output. It is conceivable that this is because an optical gain of an element in which the waveguide width of the SOA is smaller than that of the DFB laser and the like illustrated in FIG. 12(a), also increases due to an increase in current density, which compensates for a decrease in the optical confinement factor.

As described above with reference to FIGS. 11 and 12, by optimizing the waveguide width of the SOA, the deterioration of the optical signal waveform quality due to the pattern effect was suppressed and an improvement effect of the optical waveform quality sufficient to have a clear eye pattern was confirmed.

INDUSTRIAL APPLICABILITY

The present invention can be used for optical communication. For example, the present invention can be used for optical transmitters.

The invention claimed is:

1. An optical transmitter comprising, on a substrate,
a distributed feedback (DFB) laser including an active region with a multi quantum well;
an electro-absorption (EA) modulator including an absorption region with a multi quantum well having a composition different from the multi quantum well of the DFB laser, and configured to modulate light emitted from the DFB laser; and
a semiconductor optical amplifier (SOA) having an active region with an identical composition as the active region of the DFB laser and configured to amplify signal light from the EA modulator,
wherein the DFB laser, the EA modulator, and the SOA are monolithically integrated on the substrate, and
wherein a width of a core layer in a cross section perpendicular to an optical waveguide direction of the SOA is smaller than a width of a core layer in the cross section perpendicular to the optical waveguide direction of the DFB laser.

2. The optical transmitter according to claim 1, wherein optical waveguide structures of the DFB laser and the SOA are an identical layer structure and an identical composition.

3. The optical transmitter according to claim 1, wherein the width of the core layer of the SOA is 0.8 μm or more and 2.0 μm or less.

4. The optical transmitter according to claim 1, wherein optical waveguide structures of the DFB laser and the SOA are formed through a batch process.

* * * * *